US009242333B2

(12) United States Patent
Hicks et al.

(10) Patent No.: US 9,242,333 B2
(45) Date of Patent: Jan. 26, 2016

(54) SYSTEMS AND METHODS FOR INGOT GRINDING

(71) Applicant: MEMC Singapore Pte. Ltd., Singapore (SG)

(72) Inventors: James A. Hicks, Foley, MO (US); Nicholas R. Mercurio, O'Fallon, MO (US)

(73) Assignee: MEMC Singapore Pte. Ltd., Singapore (SG)

( * ) Notice: Subject to any disclaimer, the term of this patent is extended or adjusted under 35 U.S.C. 154(b) by 197 days.

(21) Appl. No.: 13/875,662

(22) Filed: May 2, 2013

(65) Prior Publication Data

US 2013/0295403 A1    Nov. 7, 2013

Related U.S. Application Data

(60) Provisional application No. 61/641,615, filed on May 2, 2012, provisional application No. 61/657,362, filed on Jun. 8, 2012.

(51) Int. Cl.

| C01B 33/02 | (2006.01) |
|---|---|
| B32B 27/32 | (2006.01) |
| B32B 9/04 | (2006.01) |
| B32B 13/04 | (2006.01) |
| B21C 1/00 | (2006.01) |
| B24B 9/06 | (2006.01) |

(Continued)

(52) U.S. Cl.
CPC . B24B 9/06 (2013.01); C01B 33/02 (2013.01); C30B 29/06 (2013.01); C30B 33/00 (2013.01); *Y10T 428/12236* (2015.01); *Y10T 428/12285* (2015.01)

(58) Field of Classification Search
CPC .......... B24D 9/06; C01B 33/02; C30B 33/00; C30B 29/06
USPC .......... 423/348; 428/446, 578, 220, 64.1, 585
See application file for complete search history.

(56) References Cited

U.S. PATENT DOCUMENTS

| 5,490,811 A * | 2/1996 | Hosokawa ............ 451/239 |
| 6,034,322 A * | 3/2000 | Pollard ............ 136/256 |
| 2009/0060821 A1 | 3/2009 | Menzel et al. |

(Continued)

FOREIGN PATENT DOCUMENTS

| JP | 2011235408 A | 11/2011 |
| WO | 2005122225 A1 | 12/2005 |
| WO | 2011066491 A2 | 6/2011 |

OTHER PUBLICATIONS

Machine Translation of Kajimoto et al. (WO/2005/122225) retried from the WIPO website on Feb. 23, 2015, 5 pages.*

(Continued)

*Primary Examiner* — Jonathan Langman
(74) *Attorney, Agent, or Firm* — Armstrong Teasdale LLP

(57) ABSTRACT

A method of grinding an ingot for use in manufacturing a semiconductor or solar wafer is disclosed. The method includes providing an ingot including four flat sides and four rounded corner portions, each corner portion extending between an adjacent pair of the flat sides, and grinding a plurality of planar facets on each corner portion, each planar facet of the corner portion joined to an adjacent facet at a juncture and oriented such that each corner portion has a substantially arcuate shape. A wafer and ingot are also disclosed.

11 Claims, 6 Drawing Sheets

(51) Int. Cl.
*C30B 29/06* (2006.01)
*C30B 33/00* (2006.01)

(56) References Cited

U.S. PATENT DOCUMENTS

2010/0282036 A1 11/2010 Nishino et al.
2011/0039411 A1 2/2011 Moeckel et al.
2011/0101504 A1 5/2011 Bhagavat et al.
2011/0165823 A1 7/2011 Ide et al.
2011/0306277 A1 12/2011 Yoshida et al.

OTHER PUBLICATIONS

International Search Report and Written Opinion of the International Searching Authority regarding PCT/SG2013/000175 mailed on Jun. 24, 2014; 9 pgs.

* cited by examiner

SYSTEMS AND METHODS FOR INGOT GRINDING

CROSS-REFERENCE TO RELATED APPLICATIONS

This application claims priority to U.S. Provisional Patent Application No. 61/641,615 filed on May 2, 2012, and U.S. Provisional Patent Application No. 61/657,362 filed on Jun. 8, 2012, the entire disclosures of which are hereby incorporated by reference in their entireties.

FIELD

This disclosure generally relates to ingots for producing wafers such as silicon semiconductor and solar wafers, and more specifically, to grinding ingots used to produce wafers.

BACKGROUND

Single crystal silicon is the starting material in many processes for fabricating semiconductor electronic components and solar materials. For example, semiconductor wafers produced from silicon ingots are commonly used in the production of integrated circuit chips on which circuitry is printed.

To produce the semiconductor or solar wafers, a single crystal silicon ingot may be produced by melting polycrystalline silicon in a crucible, dipping a seed crystal into the molten silicon, withdrawing the seed crystal in a manner sufficient to achieve the diameter desired for the ingot, and growing the ingot at that diameter. The silicon ingot is then machined into a desired shape from which the semiconductor or solar wafers can be produced. For example, slicing a cylindrical ingot into thin, circular sheets produces circular wafers.

In some applications, a silicon ingot is machined into a pseudo-square ingot. To ensure precise dimensions, a grinding process is commonly used to improve certain features (e.g., flatness, parallelism, and surface finish) of the ingot. For example, in a true round grind process, the pseudo-square ingot is continuously rotated while a grinding surface grinds the ingot, grinding rounded portions on the pseudo-square ingot. However, at least some known grinding processes include rotating the ingot such that the grinding surface impacts the ingot, which may result in cracks, chips, and/or other damage to the ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect of the present disclosure is a method of grinding an ingot for use in manufacturing a semiconductor or solar wafer. The method includes providing an ingot including four flat sides and four rounded corner portions, each corner portion extending between an adjacent pair of the flat sides, and grinding a plurality of planar facets on each corner portion, each planar facet of the corner portion joined to an adjacent facet at a juncture and oriented such that each corner portion has a substantially arcuate shape.

Another aspect of the present disclosure is an ingot of semiconductor or solar material. The ingot includes four flat sides, and a corner portion extending between each adjacent pair of the flat sides, each corner portion including a plurality of planar facets, each planar facet of the corner portion joined to an adjacent facet at a juncture and oriented such that each corner portion has a substantially arcuate shape.

Yet another aspect of the present disclosure is a wafer of solar or semiconductor material. The wafer includes a plurality of flat sides, and a corner portion extending between an adjacent pair of the flat sides, the corner portion including a plurality of planar facets, each planar facet of the corner portion joined to an adjacent facet at a juncture and oriented such that the corner portion has a substantially arcuate shape.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
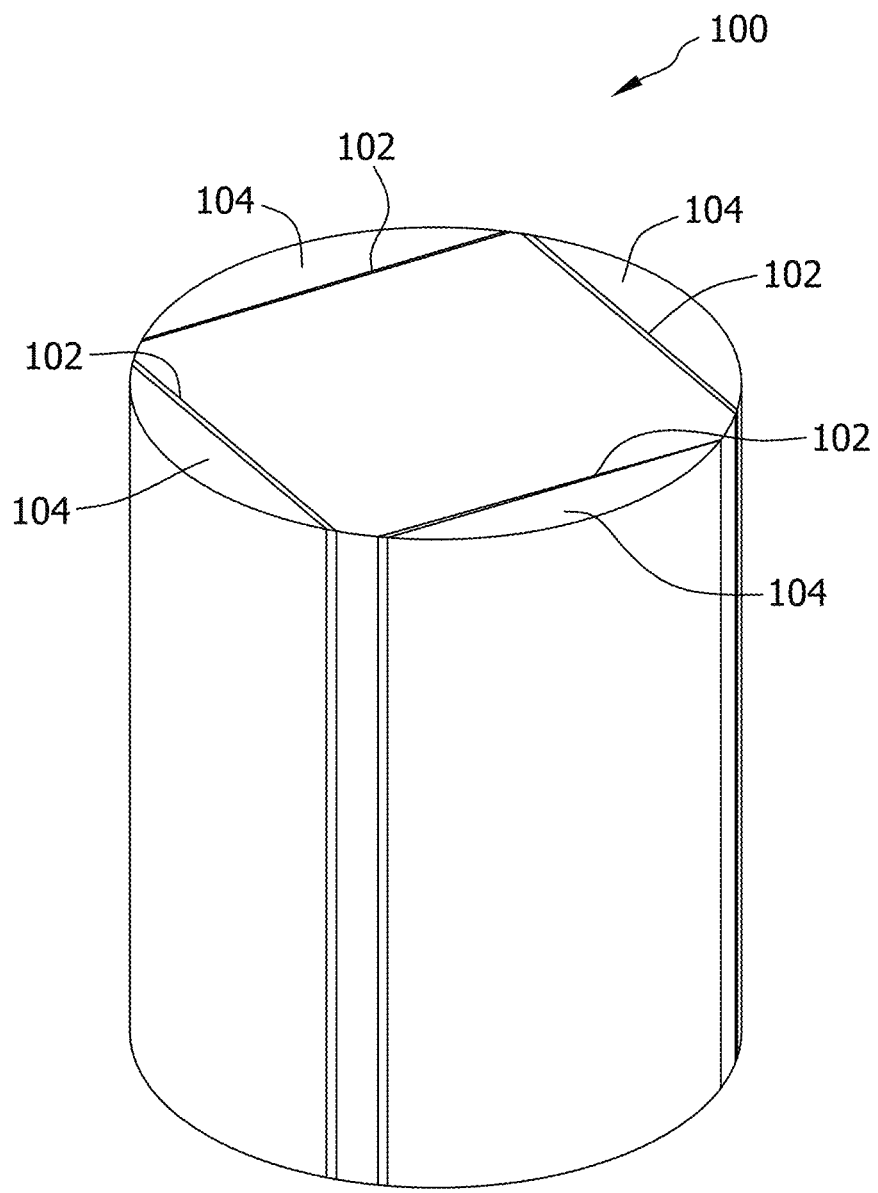
FIG. 1 is a perspective view of a mono-crystalline cylindrical ingot.

Referring initially to FIG. 1, a mono-crystalline cylindrical ingot is indicated generally at 100. While ingot 100 is a mono-crystalline ingot, the methods and systems described herein may also be applied to polycrystalline ingots. Ingot 100 is usable as a semiconductor or solar material. In this embodiment, ingot 100 is made of silicon. In other embodiments, ingot 100 may be of any suitable material, including for example silicon germanium. Cylindrical ingot 100 is produced using the Czochralski method. Alternatively, ingot 100 may be produced using any suitable method.

To form a pseudo-square ingot from cylindrical ingot 100, the cylindrical ingot is cut along four cut lines 102 using a suitable cutting tool, such as a band saw, an outer diameter blade, and/or a diamond wire saw. By slicing ingot 100 along each cut line 102, four pieces 104 are severed from the ingot 100 to form a pseudo-square ingot as further described below.

Figure 2:
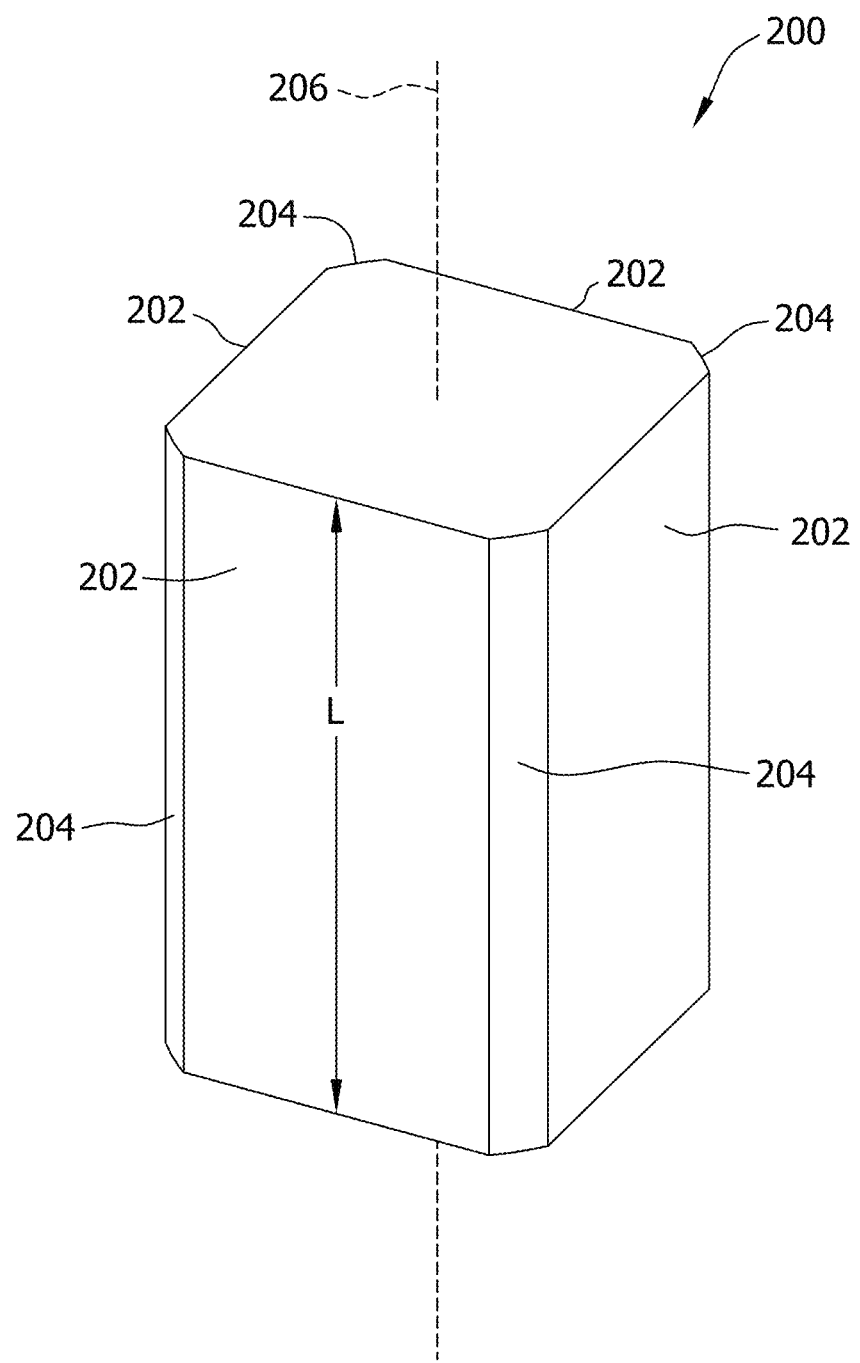
FIG. 2 is a perspective view of a pseudo-square ingot of one embodiment that may be formed from the cylindrical ingot shown in FIG. 1.
Figure 3:
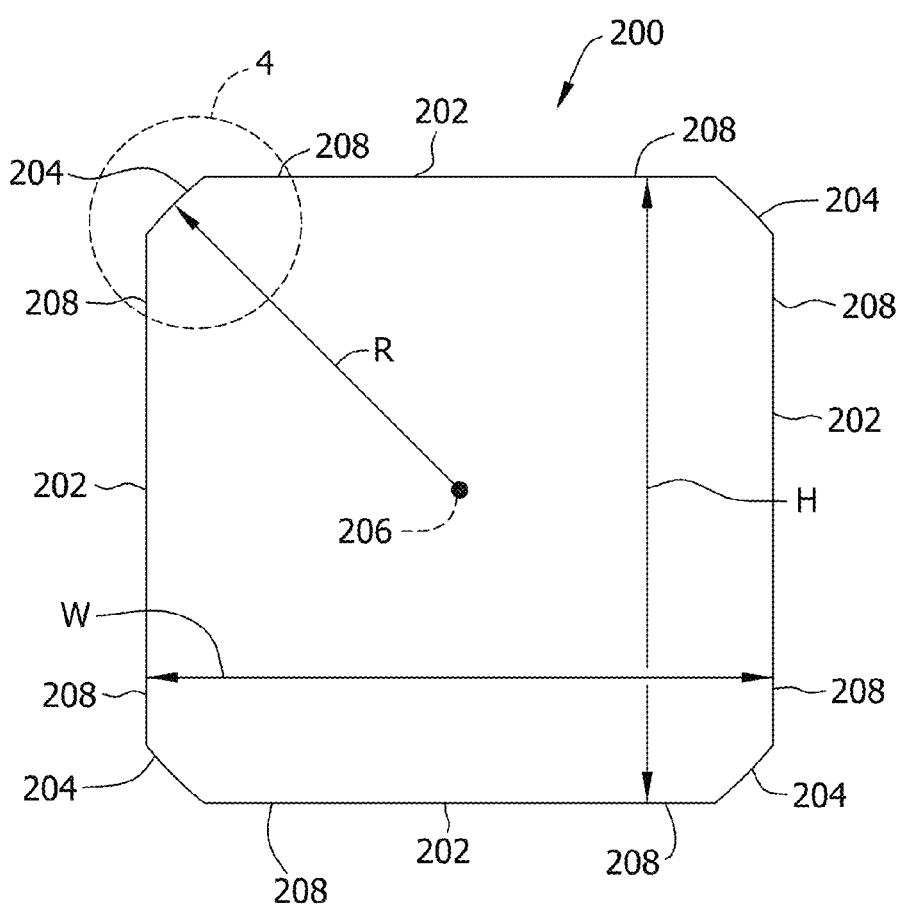
FIG. 3 is a front view of the pseudo-square ingot shown in FIG. 2.

Referring to FIGS. 2 and 3, a mono-crystalline pseudo-square ingot is indicated generally at 200. Pseudo-square ingot 200 is formed by cutting cylindrical ingot 100, as described above in reference to FIG. 1. Pseudo-square ingot 200 has four flat sides 202, each flat side 202 created by slicing off a piece 104 of cylindrical ingot 100. A longitudinal axis 206 extends through pseudo-square ingot 200.

Pseudo-square ingot 200 also includes four rounded corner portions 204. Each corner portion 204 is curved and has the same radius as the original cylindrical ingot 100. Each corner portion 204 extends between a pair of flat sides 202, and flat sides 202 meet each corner portion 204 at an interface 208.

Pseudo-square ingot 200 has a length, L, a width, W, and a height, H. Depending on the manufacturing process, the width W and height H may be in a range of 120 millimeters (mm) to 170 mm, and the length L may be in a range of 180 mm to 560 mm. In the exemplary embodiment, cylindrical ingot 100 has a radius in a range of 100 mm to 105 mm, and the resulting pseudo-square ingot 200 has a width W and height H of approximately 158 mm prior to grinding. In another embodiment, cylindrical ingot 100 has a radius of approximately 80 mm, and the resulting pseudo-square ingot 200 has a width W and height H of approximately 125 mm.

Rounded corner portions 204 of pseudo-square ingot 200 have a radius, R. In the exemplary embodiment, for a pseudo-square ingot 200 having a width W and a height H of approximately 158 mm prior to grinding, the radius R is in a range from 100 mm to 105 mm prior to grinding.

To precisely control the dimensions of pseudo-square ingot 200, flat sides 202 and/or corner portions 204 are subjected to a grinding process. After grinding, in the exemplary embodiment, the width W and height H are approximately 156 mm, and the radius R of each corner portion 204 is approximately 100 mm. The length L is unchanged by the grinding process. In other embodiments, cylindrical ingot 100 and pseudo-square ingot 200 may have other suitable dimensions.

Figure 4:
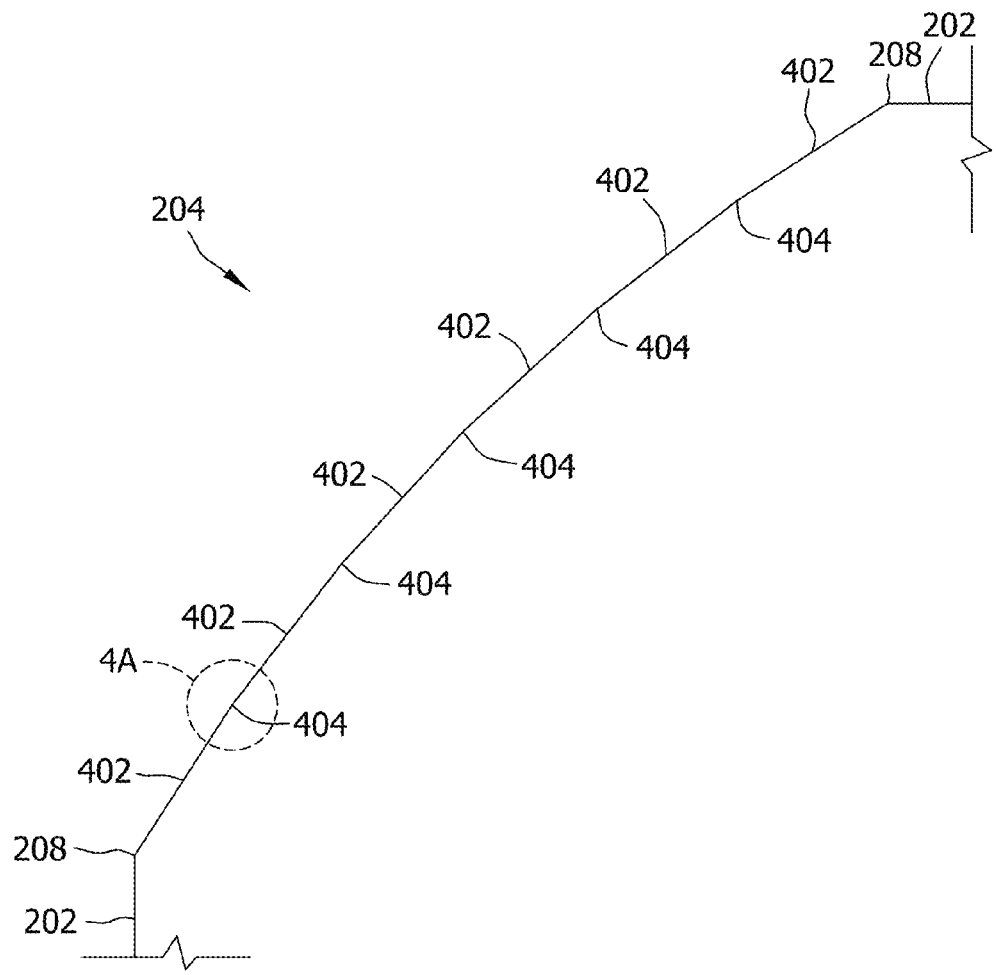
FIG. 4 is an enlarged view of a corner portion of the pseudo-square ingot shown as area 4 in FIG. 3.
Figure 4A:
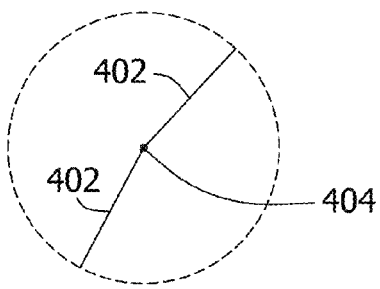
FIG. 4A is an enlarged view of the corner portion shown as area 4A in FIG. 4.

FIG. 4 is an enlarged view of a portion of ingot 200 shown as area 4 in FIG. 3. Specifically, FIG. 4 shows a corner portion 204 and portions of two flat sides 202 after a grinding process. FIG. 4A is an enlarged view of corner portion 204 shown as area 4A in FIG. 4.

Corner portion 204 is suitably ground using a multi-faceted grinding process. That is, corner portion 204 is ground such that a plurality of substantially planar facets 402 form corner portion 204. Although each facet 402 is substantially planar, facets 402 meet one another at junctures 404, and are oriented relative to one another to give corner portion 204 a somewhat arcuate shape.

In the exemplary embodiment, corner portion 204 has six facets 402, and each facet 402 has the same dimensions. Alternatively, corner portion 204 has any suitable number of facets 402 with any suitable dimensions. Notably, the more facets 402 that form corner portion 204, the closer corner portion 204 approximates a true arcuate shape.

Figure 5:
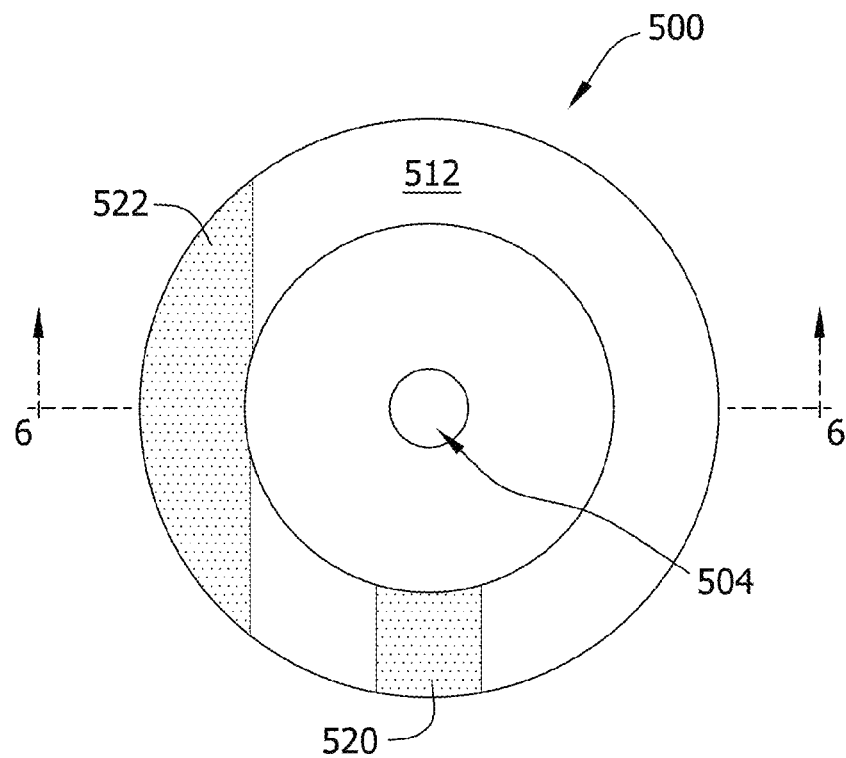
FIG. 5 is a plan view of a cup wheel of one embodiment.
Figure 6:
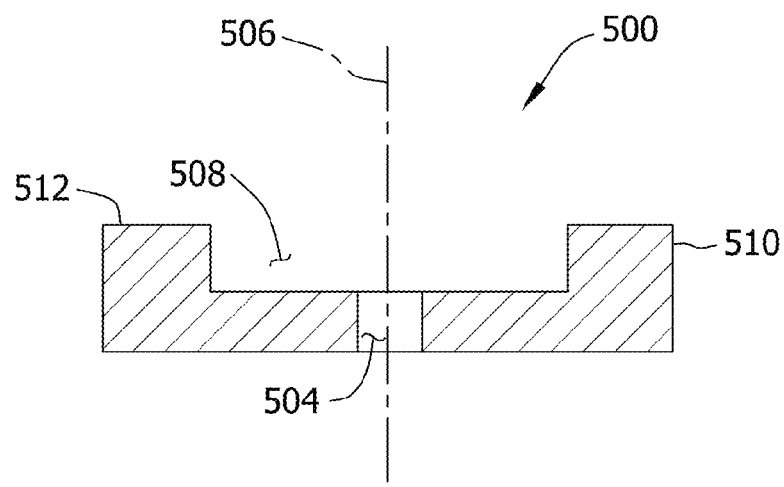
FIG. 6 is a cross-sectional view of the cup wheel taken along line 6-6 in FIG. 5.

Referring to FIGS. 5 and 6, an example cup wheel that may be used to grind pseudo-square ingot 200 is indicated generally at 500. Specifically, FIG. 5 shows a plan view of cup wheel 500. FIG. 6 shows a cross-sectional view of cup wheel 500 taken along line 6-6. While in the exemplary embodiment, cup wheel 500 is used to grind pseudo-square ingot 200, alternatively, any suitable grinding tool may be used.

Cup wheel 500 includes a mounting hole 504 extending therethrough. The mounting hole 504 defines a rotational axis 506 of the cup wheel 500. A disk-shaped recess 508 in cup wheel 500 is bordered by a rim 510. Rim 510 includes a grinding surface 512 that is substantially orthogonal to rotational axis 506. Cup wheel 500 may be a metal band cup wheel, a resin bond cup wheel, a ceramic cup wheel, or any other type of cup wheel that enables grinding pseudo-square ingot 500 as described herein.

A shaft or other suitable rotational mechanism is coupled to cup wheel 500 within mounting hole 504. By mechanically driving the shaft, cup wheel 500 rotates about rotational axis 506. To grind pseudo-square ingot 200, cup wheel 500 is driven at a predetermined rotational speed, and advanced towards pseudo-square ingot 200 along rotational axis 506 at a predetermined feed rate. In the exemplary embodiment, the rotational speed of cup wheel 500 is within a range of 2000 to 4000 revolutions per minute, and the feed rate of cup wheel is within a range of 200 mm/minute to 7000 mm/minute. The rotational speed and/or feed rate may be varied depending on the depth of the cut. When grinding surface 512 contacts a surface of pseudo-square ingot 200 (i.e., one of flat sides 202 or corner portion 204), cup wheel 500 grinds the contacted surface.

The portion of grinding surface 512 that contacts a surface of pseudo-square ingot 200 depends on the orientation of cup wheel 500 with respect to pseudo-square ingot 200. Specifically, in this embodiment, cup wheel 500 is oriented such that a narrow contact area 520 of cup wheel 500 contacts pseudo-square ingot 200. Alternatively, cup wheel 500 may be oriented such that a wide contact area 522 of cup wheel 500 contacts pseudo-square ingot 200. Notably, when using narrow contact area 520, as opposed to wide contact area 522, a higher feed rate (i.e., the rate at which grinding surface 512 is advanced towards pseudo-square ingot 200) may be used. Accordingly, forming facets 402 using the narrow contact area 520 reduces an associated grinding cycle time as compared to grinding methods utilizing wide contact area 522.

To form a facet 402 on corner portion 204, pseudo-square ingot 200 is rotated about longitudinal axis 206 until rotational axis 506 of cup wheel 500 is substantially perpendicular to the facet 402 to be formed, such that grinding surface 512 is oriented substantially parallel to the facet 402 to be formed. Cup wheel 500 is then rotated about rotational axis 506 and advanced towards corner portion 204. Accordingly, when cup wheel 500 contacts and grinds corner portion 204, the facet 402 formed by grinding is oriented substantially parallel to grinding surface 512. After the facet 402 is ground, cup wheel 500 is retracted along rotational axis 506.

This process is repeated to form all facets 402 on corner portion 204. That is, for each facet 402, pseudo-square ingot 200 is rotated to the appropriate position, cup wheel 500 is advanced towards corner portion 204 to grind the facet 402, and cup wheel 500 is retracted after grinding the facet 402. Alternatively, a plurality of cup wheels 500 may be used to simultaneously grind pseudo-square ingot 200. For example, in one embodiment, each corner portion 204 is ground using a separate cup wheel 500. Further, to improve grinding time, at least some facets 402 may be ground in a two-step process including a rough grind using a cup wheel 500 with a relatively rough grinding surface 512 followed by a fine grind using a cup wheel 500 with a relatively fine grinding surface 512.

In the exemplary embodiment, ends of pseudo-square ingot 200 are clamped by rotating components (not shown) such that pseudo-square ingot 200 may be quickly and easily rotated during the grinding process. Accordingly, the entire grinding process may be completed by rotating pseudo-square ingot 200 and grinding using one or more cup wheels 500. Alternatively, the grinding methods and systems described herein may be implemented using other suitable components.

Unlike a traditional round grind process, pseudo-square ingot 200 does not continuously rotate about longitudinal axis 206 while cup wheel 500 grinds corner portions 204. That is, during a true round grinding process, pseudo-square ingot 200 continuously rotates while grinding surface 512 contacts corner portions 204. Accordingly, during a true round grind process, for each corner portion 204, grinding surface 512 impacts corner portion 204 at interface 208. Such impacts may be referred to as an interrupted cut, and may cause impact damage, micro-cracks, and/or chips in pseudo-square ingot 200. In contrast, as pseudo-square ingot 200 is not continuously rotated while cup wheel 500 grinds facets 402, the multi-faceted grinding process described herein eliminates interrupted cuts and any associated damage.

As compared to traditional round grind processes, the multi-faceted grinding process also improves the cycle time for grinding pseudo-square ingot 200 and extends the life of cup wheel 500. Specifically, because pseudo-square ingot 200 is not rotating while cup wheel 500 grinds facets 402, cup wheel 500 is able to grind at a higher rate than if pseudo-square ingot 200 were rotating during grinding. For example, to avoid damage to cup wheel 500, in a traditional round grind process, cup wheel 500 may grind at a rate of approximately 100 mm/minute. In contrast, in the grinding process described herein, cup wheel 500 may grind at much higher rates (e.g., 1000 mm/minute) without damaging cup wheel 500.

To further approximate an arcuate shape of corner portion 204, a dithering process may be applied at junctures 404 between facets 402. To dither each juncture 404, the pseudo-square ingot 200 is repeatedly rotated back and forth (i.e. oscillated) about longitudinal axis 206 in relatively small increments while grinding surface 512 contacts corner portion 204 at the juncture 404. This process grinds and smooths the juncture 404 between facets 402, giving corner portion 204 a more rounded, creaseless shape. Dithering may also be used to smooth the interfaces 208 between flat sides 202 and corner portions 204 to form smooth surfaces between flat sides 202 and corner portions 204.

To form wafers, the pseudo-square ingot 200 is sliced in planes perpendicular to the longitudinal axis 206. Accordingly, similar to pseudo-square ingot 200, the wafers have flat sides 202 and corner portions 204 with facets 402. In the exemplary embodiment, each wafer has a thickness between 180 and 200 micrometers.

Figure 7:
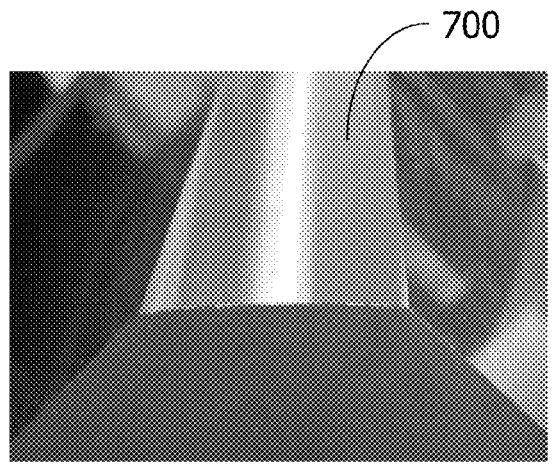
FIG. 7 is an image of a corner portion of a pseudo-square ingot after a true round grinding process.
Figure 8:
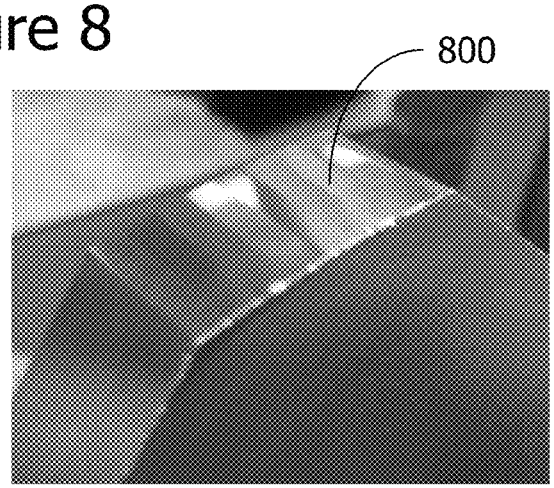
FIG. 8 is an image of a corner portion of a pseudo-square ingot after a multi-faceted grinding process.
Figure 9:
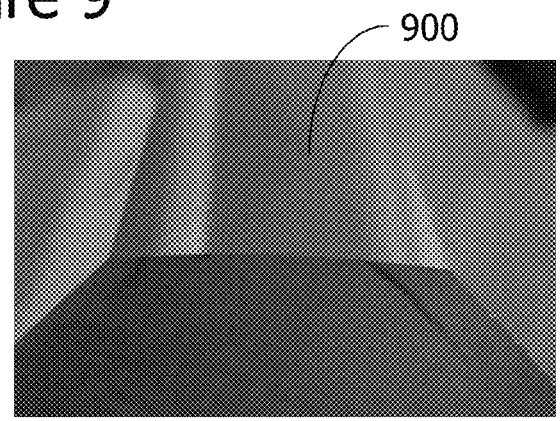
FIG. 9 is an image of a corner portion of a pseudo-square ingot after a multi-faceted grinding process with dithering.

FIGS. 7-9 are images of corner portions ground using various methods. FIG. 7 is an image of a corner portion 700 ground using a traditional round grinding process. FIG. 8 is an image of a corner portion 800 ground using a multi-faceted grinding process as described herein. FIG. 9 is an image of a corner portion 900 ground using a multi-faceted grinding process and a dithering process to smooth the junctures between the facets.

Corner portions 700, 800, and 900 all have similar overall dimensions. As can be seen, multi-faceted corner portion 800 has an obvious visual difference from rounded corner portion 700. However, the only visible difference between rounded corner portion 700 and dithered corner portion 900 are relatively small grinding marks.

A system for use in grinding an ingot includes a grinding wheel, such as cup wheel 500. The grinding wheel is configured to grind planar facets 402 on each corner portion 204. The planar facets 402 on each corner portion 204 are oriented with respect to one another such that each corner portion 204 has a substantially arcuate shape.

Embodiments of the methods and systems described herein achieve superior results compared to prior methods and systems. For example, unlike at least some known grinding methods, the multi-faceted grinding methods described herein do not involve impacting the ingot during an interrupted cut. Accordingly, the multi-faceted grinding methods described herein prevent micro-cracks, chipping, and/or other damage to the ingot that may result from an interrupted cut. Embodiments of the systems and methods described herein may also reduce the cycle time in grinding an ingot, and therefore the cost of producing semiconductor wafers from the ingot. For example, the facets described herein may be ground using a narrow contact area of a cup wheel operating at a higher feed rate than methods utilizing a wide contact area of a cup wheel. Generally, ingots ground using the embodiments described herein may be easier, faster, less expensive, and/or safer to grind than ingots utilizing prior systems.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A wafer of solar or semiconductor material, the wafer comprising:
   a plurality of flat sides; and
   a corner portion extending between an adjacent pair of the flat sides, the corner portion including a plurality of planar facets, each planar facet of the corner portion joined to an adjacent facet at a juncture and oriented such that the corner portion has a substantially arcuate shape, wherein the corner portion includes a finite number of planar facets and includes at least six planar facets.

2. A wafer in accordance with claim 1, wherein each juncture is rounded such that the corner portion has a smooth, creaseless surface formed by the finite number of planar facets.

3. A wafer in accordance with claim 1, wherein the corner portion includes a first planar facet joined to a first flat side at a first interface and a second planar facet joined to a second flat side at a second interface, and wherein the first and second interfaces are rounded to form smooth surfaces between the corner portion and the first and second flat sides.

4. A wafer in accordance with claim 1, wherein the wafer comprises four flat sides and four corner portions.

5. A wafer in accordance with claim 1, wherein the wafer is made of mono-crystalline silicon.

6. A wafer in accordance with claim 1, wherein the substantially arcuate corner portion has a radius of approximately 100 millimeters.

7. A wafer in accordance with claim 1, wherein each of the plurality of planar facets has the same length.

8. A wafer in accordance with claim 1, wherein the wafer has a thickness between approximately 180 and 200 micrometers.

9. A wafer in accordance with claim 1, wherein the corner portion includes only six planar facets.

10. A wafer in accordance with claim 1, wherein the plurality of facets are formed by grinding an ingot with at least one cup wheel, and slicing the ground ingot.

11. A wafer in accordance with claim 10, wherein the plurality of facets are formed by grinding the ingot using both a first cup wheel with a rough grinding surface and a second cup wheel with a fine grinding surface.

* * * * *